United States Patent
Kao et al.

(10) Patent No.: US 7,183,801 B2
(45) Date of Patent: Feb. 27, 2007

(54) PROGRAMMABLE LOGIC AUTO WRITE-BACK

(75) Inventors: Oliver C. Kao, Cupertino, CA (US); Nancy D. Kunnari, Los Altos, CA (US)

(73) Assignee: Atmel Corporation, San Jose, CA (US)

( * ) Notice: Subject to any disclaimer, the term of this patent is extended or adjusted under 35 U.S.C. 154(b) by 83 days.

(21) Appl. No.: 10/937,817

(22) Filed: Sep. 8, 2004

(65) Prior Publication Data

US 2006/0050568 A1 Mar. 9, 2006

(51) Int. Cl.
*H03K 19/177* (2006.01)

(52) U.S. Cl. .......................................... 326/40; 326/41
(58) Field of Classification Search ................. 326/38, 326/39, 40, 41, 47
See application file for complete search history.

(56) References Cited

U.S. PATENT DOCUMENTS

| | | | | |
|---|---|---|---|---|
| 4,524,430 A | 6/1985 | Page | ........................... | 365/189 |
| 4,879,688 A | 11/1989 | Turner et al. | ................ | 365/201 |
| 4,930,098 A | 5/1990 | Allen | ........................... | 364/716 |
| 4,930,107 A | 5/1990 | Chan et al. | ............. | 365/189.08 |
| 4,940,909 A | 7/1990 | Mulder et al. | .............. | 307/465 |
| 5,291,079 A | 3/1994 | Goetting | ..................... | 307/465 |
| 5,426,378 A | 6/1995 | Ong | .............................. | 326/39 |
| 5,808,942 A | 9/1998 | Sharpe-Geisler | ....... | 365/189.08 |
| 5,844,422 A | 12/1998 | Trimberger et al. | .......... | 326/38 |
| 5,869,979 A * | 2/1999 | Bocchino | ...................... | 326/38 |
| 6,208,162 B1 * | 3/2001 | Bocchino | ...................... | 326/38 |
| 6,255,848 B1 | 7/2001 | Schultz et al. | ................. | 326/41 |
| 6,351,139 B1 | 2/2002 | Ighani et al. | .................. | 326/38 |
| 6,404,224 B1 | 6/2002 | Azegami et al. | ............. | 326/38 |
| 6,469,540 B2 | 10/2002 | Nakaya | ........................ | 326/41 |
| 6,573,748 B1 | 6/2003 | Trimberger | ................... | 326/38 |

* cited by examiner

*Primary Examiner*—Daniel Chang
(74) *Attorney, Agent, or Firm*—Schneck & Schneck; Thomas Schneck

(57) ABSTRACT

A first configuration controller loads configuration data into a programmable logic device. The first controller is coupled with a first configuration memory and manages couplings of the memory to a first load path. The load path couples to a latch ring, which receives configuration data from the first memory. An array of configuration latches receives the configuration from the latch ring and effects a configuration of the programmable device. A write-back path couples the latch ring and first configuration memory. A write-back controller manages write-back operations of configuration data from the latch ring to the configuration memory. A second configuration controller is coupled to a second configuration memory, which is coupled to a second load path. The second controller and second memory operate like the first. The write-back controller can be configured to couple to the second memory and facilitate development processes by a writing-back developmental configurations.

18 Claims, 4 Drawing Sheets

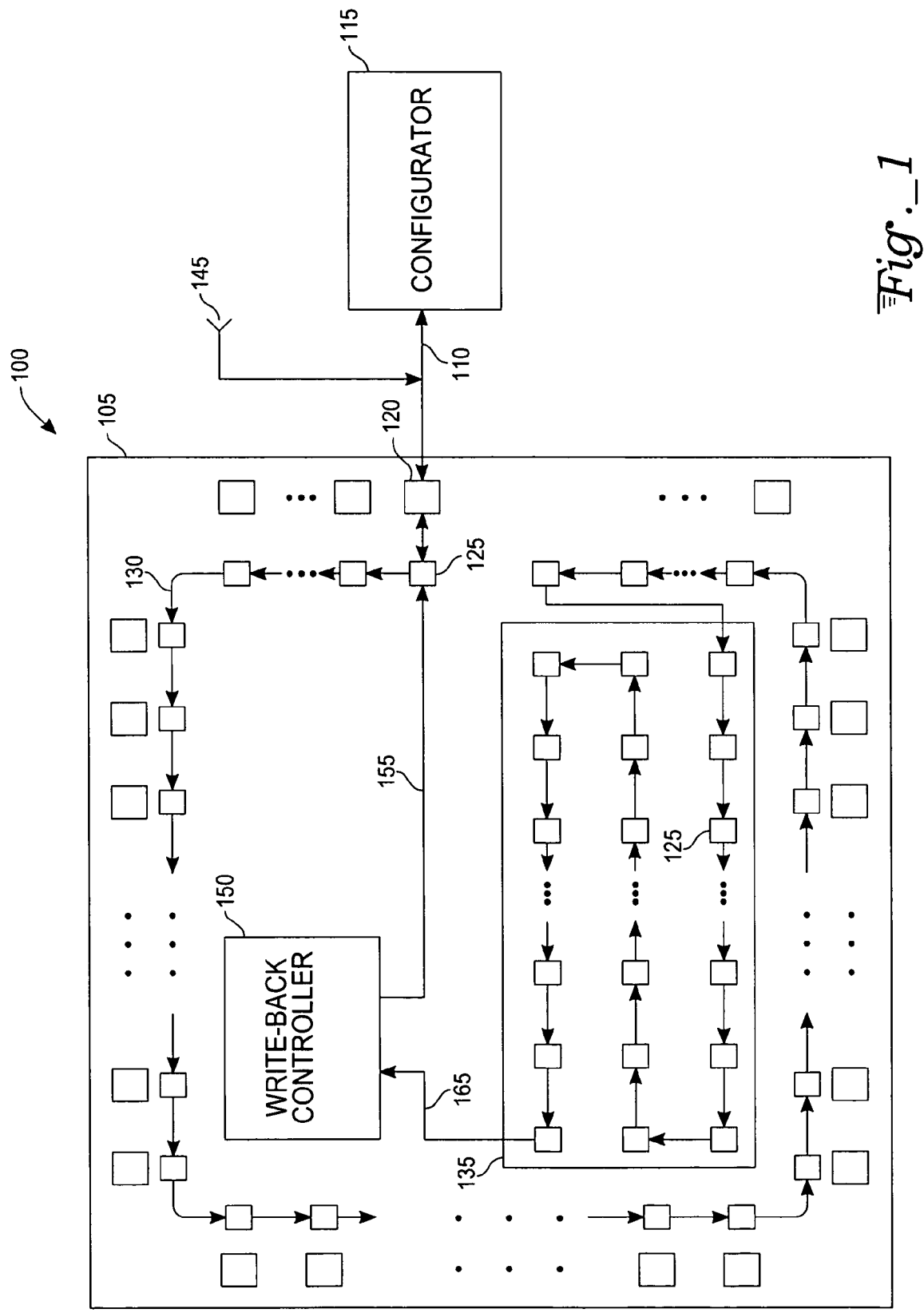
Fig._1

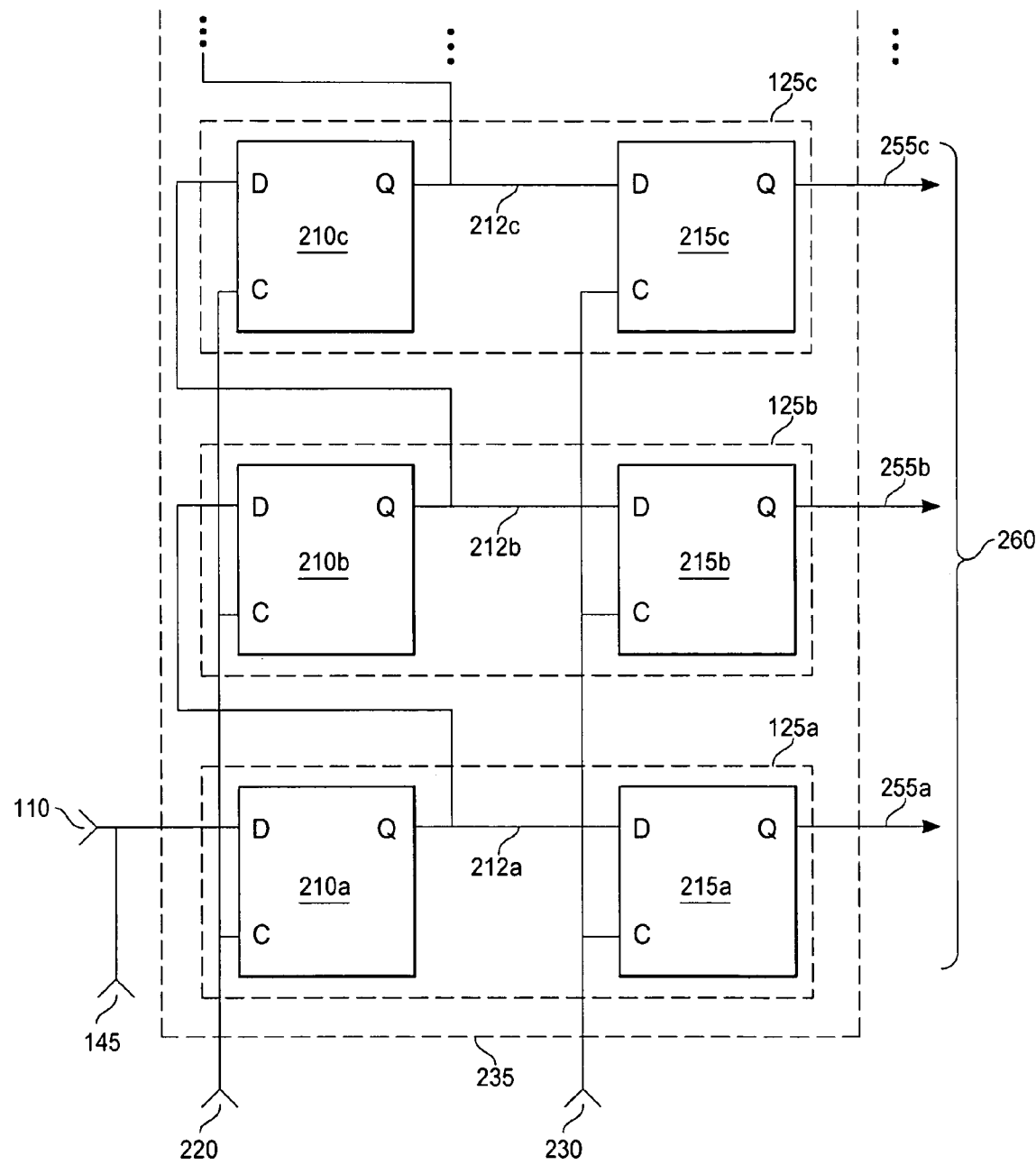
Fig._2

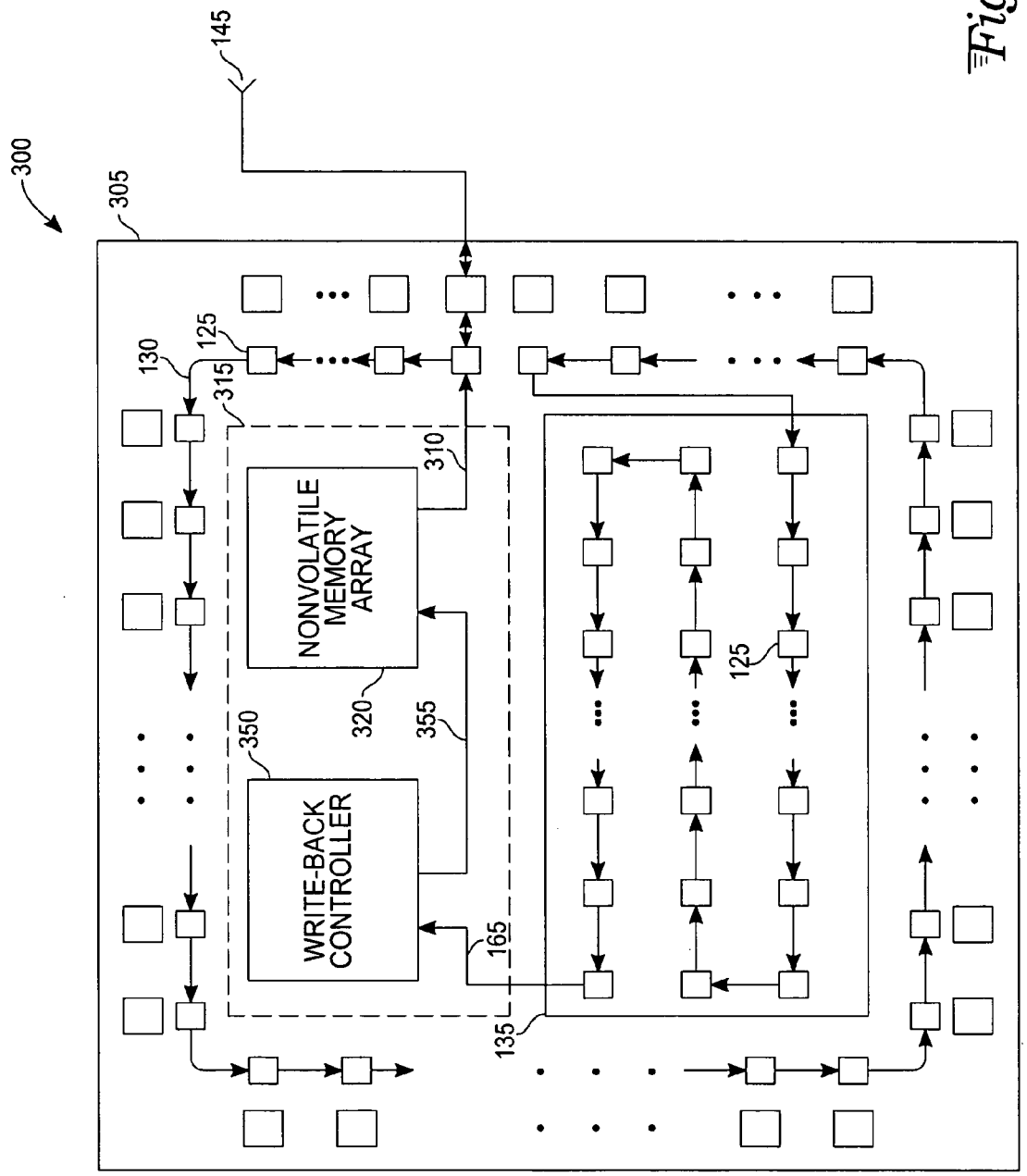
Fig._3

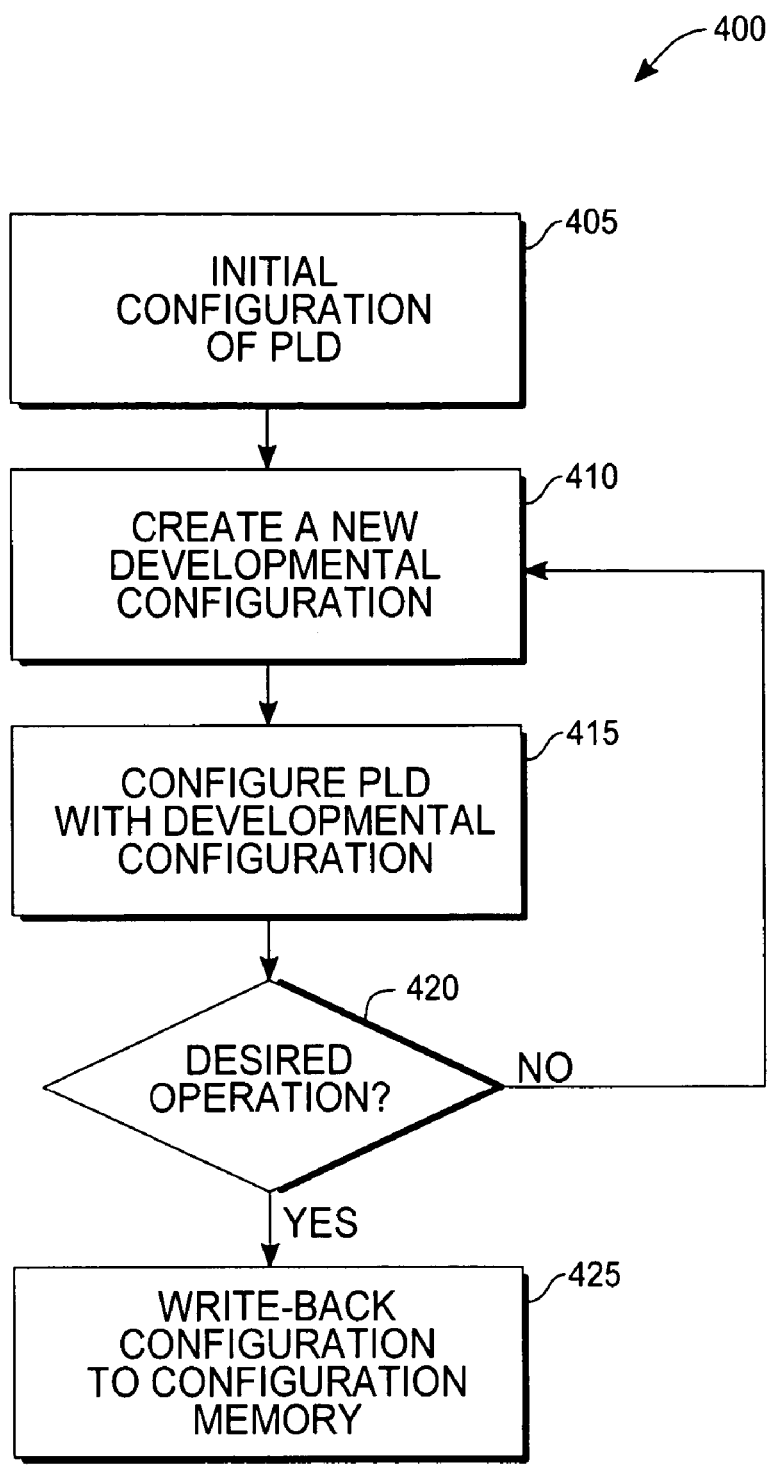
Fig._4

PROGRAMMABLE LOGIC AUTO WRITE-BACK

TECHNICAL FIELD

The invention relates to programmable logic devices and the management of programmable device configurations. More specifically, the present invention relates to the automatic write-back of configurations in field programmable gate arrays and programmable logic devices.

BACKGROUND ART

Integrated circuits may generally be categorized into various groups such as microprocessors, memories, programmable logic devices, and application specific integrated circuits (ASICs). With the semiconductor industry continually driven to reduce a product cost coupled with shorter product life spans, manufacturers have been under tremendous pressure to reduce research and development (R&D) costs for new products. Programmable logic products have gained momentum and have out-grown the ASIC business. In the early phases of development, programmable logic products provide design alternatives for new products through a flexibility in configuration implementation.

Programmable structures such as a programmable logic device (PLD) or a field programmable gate array (FPGA) are classes of integrated circuits that can be programmed by a user to implement logic functions. These functions are determined by the fuse connections or "fuses" loaded in a device configuration process. The fuses (also called configuration bits) may be stored inside or outside the chip. The fuse configuration is either read out from a memory and shifted into latching elements within the chip or read directly from a non-volatile memory array within the chip. For instance, the fuses can be programmed or erased by an embedded high voltage circuit with a non-volatile memory array. Unlike customized hard-wired chips or ASICs, the programmable device can be easily programmed as well as reprogrammed by changing the fuses to perform a totally different logic function.

A capability of repeated programming makes programmable logic devices well suited for new product development. In a development cycle, engineers iteratively try new ideas in an integrated circuit implementation and verify that the results meet a design specification. Having a fast and easy way to implement a design concept in a programmable chip can make the iterative development cycle more efficient and productive.

The configuration data for an FPGA is stored in a separate chip called a configurator. The configurator contains non-volatile memory and logic control circuitry. When a system is powering-up, the configurator's contents are download into storage cells which are usually made of static latches within the FPGA. When powered off, an FPGA loses all configuration data stored in latches.

A PLD stores the "fuses" in a non-volatile memory array within the PLD chip. When a PLD powers up, a portion of the fuses are loaded into a series of latches and provide the necessary control of the functionality. Part of the fuses remain in the non-volatile memory array. When the chip starts functioning, the information is read out through a sense amplifier to meet speed requirements. Sense amp based fuse loading consumes a large amount of current. Recent PLD designs have incorporated a complete set of configuration latches to receive the entire set of configuration bits from the non-volatile memory array at power-up to avoid sense amp loading.

Configuration fuses can also be loaded externally from another microcontroller. Externally loaded fuses are available in addition to the previously fixed fuses loaded at system power-up or in a configurator. Externally loaded fuses offer a key flexibility for changing the functionality of a programmable logic device. The external fuses can be used to update a portion or all of the functionality of the programmable device. New functionality can be rapidly loaded and the new behavior can be tested and verified for acceptance as a new device configuration. Loading configurations with an external microcontroller also avoids the inconvenience and power consumption of going through the programming sequence of a non-volatile memory each time a new configuration is considered.

Various attempts to improve a management of programmable logic device configurations can be found. For example, U.S. Pat. No. 5,426,378, to Ong, discloses two banks of configuration memory being multiplexed to allow a device to operate with alternating configurations during a user clock cycle. U.S. Pat. No. 5,291,079, to Goetting, discloses capturing logical state data on interconnect lines with a configuration control unit and shifting the data out to a configuration register. Additional examples include U.S. Pat. No. 6,351,139, to Ighani et al., which discloses a scheme for reading and writing configuration bit data to a memory and for verification of configuration bits. U.S. Pat. No. 6,255,848, to Shultz et al., discloses configuration data bit values being transmitted on a bi-directional bus and stored in an internal shift register. Further, U.S. Pat. No. 5,808,942, to Sharpe-Geisler, proposes a new static random access memory (SRAM) cell that provides write and read capability through an internal data path using a reduced number of transistors per cell.

However, certain desirable features are neither described nor taught in the prior art. For instance, a capability to write-back a device configuration to an internal or external memory or a capability to load new configuration data or shift-out a present configuration and maintain a continuous operation of the configured programmable device are not mentioned.

The competitive pressure for new products and the ability to rapidly configure programmable logic devices to meet new product demands is a natural match. The short life span of a product adds an incentive to quickly produce a new functionality for a product. Many times the new functionality needed for a next generation product to be competitive is only an incremental amount of change compared to the previous generation. To rapidly apply a new configuration and produce a product that remains competitive in a market place is highly desirable capability for a company. Within a programmable device, the ability to mix and match features and functionality between the present configuration and that of a developmental configuration in an external configurator is one way to produce the desired capability.

What is needed is a way to rapidly complete a design and verification cycle of a proposed configuration for a new programmable logic device. In producing such a cycle, there would be an advantage to rapidly shift-out a desired new configuration after an iteration of loading and verifying a proposed configuration. An ability to capture successive configurations within the design process means that configuration milestones can be managed and a path to the next generation product rapidly achieved. An ability to quickly shift-out a given design configuration, as part of a development cycle, would accomplish such a result. Additionally, there is a desirability to apply the writing-back of configurations to either an external or internal configurator as well as to an external development configuration memory. With an added write-back capability a developer of a new functionality for a programmable logic device would be able to easily develop, verify, and retain a desired configuration.

DISCLOSURE OF INVENTION

The present invention is a device, having a first configuration controller which loads configuration data into a programmable logic device. The first configuration controller is coupled with a first configuration memory and manages couplings of the configuration memory to a first load path. The load path couples to a latch ring where configuration data is received from the first configuration memory. An array of configuration latches receives the configuration data by a shifting operation from the latch ring. The array of configuration latches effects a configuration of the programmable logic device.

A write-back path couples the latch ring and the first configuration memory. A write-back controller is coupled to the write-back path and controls a write-back operation of the configuration data in the latch ring to the first configuration memory.

The present invention is also a method for managing configuration data for a programmable logic device. A programmable logic device is configured by scanning-in an initial configuration to the latch ring followed by the configuration data being shifted into an array of configuration latches. A desired operation of the programmable logic device is determined. If operation of the device is determined to not be desirable, the process continues from the step of the creation of configuration data in the second configuration memory and iterates to the determination step until a desired operation is determined. With a determination of a desired operation of the device, the configuration is written-back to the first configuration memory for use in a next power-up of the device or for retention in the second configuration memory as a production configuration.

BRIEF DESCRIPTION OF DRAWINGS

FIG. 1 is a block diagram of an external non-volatile configurator connected serially to a programmable logic device with a scan-out shift register and controller of the present invention.

FIG. 2 is a block diagram of a shift register within a programmable logic device composed of dual latches of the present invention.

FIG. 3 is a block diagram of a programmable logic device incorporating a scan-out shift register and controller with an internal non-volatile memory for storage of a fuse array of the present invention.

FIG. 4 is a flow diagram of a configuration loading and development method incorporating a write-back capability of the present invention.

MODES FOR CARRYING OUT THE INVENTION

With reference to FIG. 1, a programmable logic system 100, which can be a PLD or an FPGA, is configured with a programmable logic device 105 connected through a serial path 110 to an external configurator 115. An initial configuration for the programmable logic device 105 is retained in the external configurator 115. A typical configuration storage device of the external configurator 115 is a non-volatile memory. At power-up, the initial configuration is shifted into the programmable logic device 105. The configuration is shifted from the external configurator 115, through the serial path 110, through one of a plurality of chip I/O cells 120, and into an internal latch ring 130. The latch ring 130 is formed by a series connection of internal two-stage latches 125 around a periphery of the programmable logic device 105. The configurator 115 shifts the initial configuration until all configuration data is contained in the latch ring 130 and a latch array 135. The latch array 135 duplicates and replaces a conventional memory array for storing configuration fuse data.

A developmental configuration may be contained in an external microcontroller and memory (not shown). The external microcontroller scans in the developmental configuration throughout the external connection 145. The external connection 145 allows the developmental configuration to be shifted in through the serial path 110 similar to the initial configuration at power-up. The developmental configuration is shifted into the latch ring 130 and on into the latch array 135. The device is put into operation, the functionality verified, and the desirability of the configuration determined. If the configuration is not a desired one an additional developmental configuration may be shifted in and the verification process repeated. When a developmental configuration is determined to be desirable, a write-back controller 150 writes-back the verified configuration to the external configurator 115. The internal write-back controller 150 receives configuration data from the latch ring 130 and the latch array 135 through a feedback path 165 and writes-back the configuration through the write-back path 155 to the external configurator 115. The new configuration may also be written-back to the external microcontroller and configuration memory for further use in configuration development. The external configuration memory is a non-volatile type. The internal write back controller can be a microcontroller or a finite state machine.

Details of the write-back operation are controlled by the write-back controller 150. Depending on the protocol details established by the external configurator, the write-back controller begins with a write-back command and a starting address. A clock signal is sent to the shift register to scan data from the last element of the first stage latches. Depending on the number of bits scanned per write-back command, the controller will need to repeat write-back commands until the shift register is scanned-out.

With reference to FIG. 2, a latch register 235 is formed by serially connecting two-stage latches 125a–125c . . . . The first stage latches 210a–210c . . . are loaded with a serial load clock signal at a first clock input terminal 220. An update clock signal is applied at a second clock input terminal 230 to load the configuration data through a set of parallel connections 212a–212c . . . to the second stage latches 215a–215c . . . . After a parallel loading of the second stage latches 215a–215c . . . , the first stage latches 210a–210c . . . are available for further scanning of data. The data stored in the second stage latches 215a–215c . . . provides a functional configuration through the outputs of the second stage latches 255a–255c. . . .

Both the latch ring 130 and the latch array 135 are composed of a latch register 235 of suitable length. In the case of the latch ring 130, the second stage latch outputs 255a–255c . . . provide configuration data for the I/O cells 120. Features such as slew rate, open-drain, pull-up, pulldown, or pin-keeper configurations are provided and maintained by the second stage latches 215a–215c . . . during operation of the chip. The first stage latches of the latch ring 130 remain free for further scanning-in of data.

The latch array 135 is composed of a plurality of two-stage latches 125 holding fuse information. Collectively, the fuses configure a logic function for the programmable logic device 105. Similar in function to the latch ring 130, the latch array 135 is first filled with fuse information scanned in to the first stage latches 210a–210c . . . . The update clock signal transfers fuse information to the second stage latches 215a–215c . . . to become a functional configuration of the chip. Configuration information may be, for example, a combinatorial product term for use in a programmable logic structure or macrocell configuration bits for a programmable gate array.

In reference to FIG. 3, an exemplary embodiment of a programmable logic system 300 is configured with a programmable logic device 305 connected through a serial path 310 to an internal configurator 315. The internal configurator 315 is composed of a write-back controller 350 and a nonvolatile memory array 320. At power up, an initial configuration retained in the nonvolatile memory array 320 is shifted into the latch ring 130 and latch array 135. The latch ring 130 and latch array 135 are composed of two-stage latches 125, detailed in FIG. 2. The update clock 230 (FIG. 2) loads the configuration data in parallel from the first stage latches 210 to the second stage latches 215 of the latch ring 130 and latch array 135 (connections not shown).

An external connector 145 provides a path for an external microcontroller and memory (not shown) to shift a developmental configuration, as described supra, into in the latch ring 130 and latch array 135. The development configuration is tested for desirability and the configuration development process continues until a desired configuration is determined. With verification of a desired configuration, the latch ring 130 and latch array 135 contents are collected from the feedback path 165 and written-back by the write-back controller 350 through the write-back path 355 to the internal nonvolatile memory array 320. The new configuration stored in non-volatile memory 320 becomes a new initial configuration loaded at power-up. The new configuration may also be written-back to the external microcontroller and configuration memory for further use in a configuration development process. The external configuration memory may be of a non-volatile type.

With reference to FIG. 4, an exemplary process flow diagram 400 of managing a configuration of a programmable logic device commences with an initial step of configuration 405 of the programmable logic device. The initial step of configuration 405 commences with a scanning-in of initial configuration data from a first configuration memory associated with an external configurator 115 (FIG. 1). The initial configuration data is shifted into an internal latch ring 130 and on to the latch array 135. The programmable logic device is then placed in operation. The method 400 continues with a creation 410 of a developmental configuration for consideration as a new functionality for the programmable logic device.

The developmental configuration is available in an external configuration memory (not shown) and is connected to the internal latch ring 130 through the external connection 145. An external microcontroller (not shown) scans in the developmental configuration through the external connection 145 to the internal latch ring 130 and latch array 135. A further configuration 415 of the programmable logic device is carried-out by scanning-in the developmental configuration to the internal latch ring 130 and latch array 135. The scanning-in of the developmental configuration to the first stage latches 210 (FIG. 2) is possible while the programmable logic device is in normal operation. The developmental configuration data is shifted to the second stage latches 215 (FIG. 2) to effect a full configuration. A next step is a determination 420 of whether a valid operation of the programmable logic device has been achieved by verifying the new functionality of the device produced by the developmental configuration.

If the determination 420 of a desirable developmental configuration step proves negative, a continuation of the method proceeds with a creation 410 of a new developmental configuration step. The method repeats after the creation step 410 until the desirability of the operation 420 is verified. If the determination 420 of the desirability of the development configuration is positive, the method continues with a writing-back 425 of the developmental configuration to the first configuration memory. Writing-back 425 is performed during full operation of the part without any interruption in functionality. For developmental purposes, a developmental configuration, determined desirable or not, may be written-back to the external configuration memory for review and editing in further iterations of the configuration development process.

Although the present invention has been described in terms of exemplary embodiments, one skilled in the art recognizes that additional embodiments could readily be conceived which are still within a scope of the present invention. For example, a particular programmable device may be a programmable logic structure, a programmable logic device, a reprogrammable gate array, or a configurable array logic device. Additionally, a skilled artisan could readily adapt the present technique of configuration management to compose new arrangements of configurable logic blocks, programmable logic interconnections, programmable gate arrays, or a configurable input/output (I/O). A skilled artisan might choose to implement a configuration memory as an electrically erasable programmable read only memory (EEPROM) or a storable configuration-image file in a disk drive as part of an integrated development environment.

What is claimed is:

1. A programmable logic device with write-back logic comprising:
   a first configuration controller;
   a first configuration memory coupled to said first configuration controller;
   a first load path coupled to said first configuration memory;
   a latch ring coupled to said first load path;
   a second load path coupled to said latch ring;
   a separate array of configuration latches coupled to said latch ring;
   a write-back path coupled to said latch ring and to said first configuration memory; and
   a write-back controller coupled to said write-back path.

2. The programmable logic device with write-back logic of claim 1, wherein said write-back controller is configured to shift said configuration data from said latch ring, through said write-back path, and to said first configuration memory.

3. The programmable logic device with write-back logic of claim 1, wherein said first load path and said write-back path form a bidirectional communication path.

4. The programmable logic device with write-back logic of claim 1, wherein said write-back controller is a microcontroller.

5. The programmable logic device with write-back logic of claim 1, wherein said write-back controller is a state machine.

6. The programmable logic device with write-back logic of claim 1, wherein said first configuration controller is configured to shift said configuration data from said first configuration memory, through said first load path, and into said latch ring.

7. The programmable logic device with write-back logic of claim 1, wherein said first configuration controller and said first configuration memory are external to said programmable logic device.

8. The programmable logic device with write-back logic of claim 1, wherein said first configuration controller and said first configuration memory are internal to said programmable logic device.

9. The programmable logic device with write-back logic of claim 1, wherein a second configuration controller is coupled to a second configuration memory, said second configuration controller configured to shift said configuration data from said second configuration memory, through said second load path, and into said latch ring.

10. The programmable logic device with write-back logic of claim 9, wherein said write-back controller is configured to write-back said configuration data from said latch ring through said write-back path to said second configuration memory.

11. The programmable logic device with write-back logic of claim 9, wherein said second configuration memory and said second configuration controller are situated externally to said programmable logic device.

12. The programmable logic device with write-back logic of claim 9, wherein said first configuration memory is a non-volatile memory.

13. The programmable logic device with write-back logic of claim 9, wherein said second configuration memory is a non-volatile memory.

14. A method for managing a configuration of a programmable logic device comprising:

configuring said programmable logic device by scanning-in configuration data into a latch ring from a first configuration memory;

shifting-in said configuration data from said latch ring to an array of configuration latches; creating configuration data in a second configuration memory;

configuring said programmable logic device by scanning-in said configuration data from said second configuration memory to said latch ring; and writing-back said configuration data to said first configuration memory.

15. The method for managing a configuration of a programmable logic device of claim 14, further comprising:

determining a valid operation of said logic device after said configuring said programmable logic device step;

iterating a portion of said method for managing a configuration process commencing at said creating configuration data step if a result from said determining a valid operation step is negative; and continuing with said writing-back said configuration data step if a result from said determining a valid operation step is positive.

16. The method for managing a configuration of a programmable logic device of claim 14, further comprising maintaining a continuous operation of a present configuration of said programmable logic device while said writing-back said configuration data step is performed.

17. The method for managing a configuration of a programmable logic device of claim 14, further comprising maintaining a continuous operation of a present configuration of said programmable logic device while said configuring said programmable logic device step is performed.

18. The method for managing a configuration of a programmable logic device of claim 14, further comprising shifting said configuration data into said second configuration memory for an update of said configuration data in an iterative process for development of programmable logic device configurations.

* * * * *